(12) United States Patent
Kashiwagi et al.

(10) Patent No.: US 11,804,398 B2
(45) Date of Patent: Oct. 31, 2023

(54) WORKPIECE SUPPORTING APPARATUS AND WORKPIECE SUPPORTING METHOD

(71) Applicant: EBARA CORPORATION, Tokyo (JP)

(72) Inventors: Makoto Kashiwagi, Tokyo (JP); Mao Izawa, Tokyo (JP)

(73) Assignee: EBARA CORPORATION, Tokyo (JP)

( * ) Notice: Subject to any disclaimer, the term of this patent is extended or adjusted under 35 U.S.C. 154(b) by 0 days.

(21) Appl. No.: 17/405,351

(22) Filed: Aug. 18, 2021

(65) Prior Publication Data

US 2022/0068695 A1 Mar. 3, 2022

(30) Foreign Application Priority Data

Aug. 28, 2020 (JP) ................................. 2020-144540

(51) Int. Cl.
*B25B 11/00* (2006.01)
*H01L 21/683* (2006.01)
*B24B 1/00* (2006.01)

(52) U.S. Cl.
CPC ............ *H01L 21/6838* (2013.01); *B24B 1/00* (2013.01)

(58) Field of Classification Search
CPC ....... H01L 21/6838; B24B 1/00; B25B 11/00; B25B 11/005
USPC .......................................................... 269/21
See application file for complete search history.

(56) References Cited

U.S. PATENT DOCUMENTS

| 10,888,977 | B2 * | 1/2021 | Li ........................ B65G 47/911 |
| 2008/0223412 | A1 * | 9/2008 | Lee ..................... H01L 21/6708 134/32 |
| 2009/0285991 | A1 * | 11/2009 | Kitano ................ H01L 21/6838 118/56 |
| 2013/0048607 | A1 * | 2/2013 | Matsushita ....... H01L 21/67028 156/345.23 |
| 2019/0118335 | A1 | 4/2019 | Kobayashi et al. |
| 2019/0270186 | A1 * | 9/2019 | Li ......................... B25B 11/005 |

FOREIGN PATENT DOCUMENTS

| CN | 104863905 A | | 8/2015 |
| JP | 2015-126174 A | | 7/2015 |
| JP | 2015126174 A | * | 7/2015 |
| JP | 2018-111146 A | | 7/2018 |
| JP | 2019-077003 A | | 5/2019 |

OTHER PUBLICATIONS

Extended European search report issued in European Patent Application No. 21191826.3 dated Jan. 18, 2022.

* cited by examiner

Primary Examiner — Lee D Wilson
(74) Attorney, Agent, or Firm — PEARNE & GORDON LLP

(57) ABSTRACT

A workpiece supporting apparatus capable of preventing a surface of a workpiece from drying out while maintaining a suction force when supporting the workpiece with a Bernoulli chuck is disclosed. The workpiece supporting apparatus includes a Bernoulli chuck configured to generate a suction force by emitting a gas; and a liquid ejection member surrounding the Bernoulli chuck and configured to discharge a liquid around the Bernoulli chuck.

9 Claims, 9 Drawing Sheets

WORKPIECE SUPPORTING APPARATUS AND WORKPIECE SUPPORTING METHOD

CROSS REFERENCE TO RELATED APPLICATION

This document claims priority to Japanese Patent Application No. 2020-144540 filed Aug. 28, 2020, the entire contents of which are hereby incorporated by reference.

BACKGROUND

Devices, such as memory circuits, logic circuits, and image sensors (e.g., CMOS sensors), are becoming more highly integrated these days. In a process for forming such a device, foreign matters (e.g., fine particles or dust) may be attached to the device. The foreign matters attached to the device can cause a short-circuit between interconnects or a circuit defect. Therefore, in order to enhance the reliability of the device, it is necessary to clean a wafer on Which devices are formed to remove the foreign matters from the wafer.

The above-described foreign matters, such as fine particles or dust, may be attached to a back surface (or a non-device surface) of a wafer. If such foreign matters are attached to the back surface of the wafer, the wafer may separate from a stage reference surface, or a front surface of the wafer may be inclined with respect to the stage reference surface in an exposure apparatus, resulting in patterning shift or deviation of focal distance. To prevent such problems, it is necessary to remove foreign matters from the back surface of the wafer.

Conventionally, a Bernoulli chuck has been used as a mechanism for supporting a workpiece, such as a wafer. The Bernoulli chuck is a chuck configured to generate a suction force by ejecting a fluid using Bernoulli's theorem, and support the workpiece in a non-contact manner through the fluid. However, since compressed air is usually used as the fluid, the surface of the workpiece supported by the Bernoulli chuck dries out. As a result, foreign matters in the air or polishing debris produced by the polishing process may be attached to the dried surface of the workpiece.

In order to prevent the surface of the workpiece from drying out, pure water, instead of compressed air, may be supplied to the Bernoulli chuck. However, supplying the pure water results in a lower suction force of the Bernoulli chuck than that when compressed air is supplied.

SUMMARY

There is provided a workpiece supporting apparatus capable of preventing a surface of a workpiece from drying out while maintaining a suction force when supporting the workpiece with a Bernoulli chuck.

Embodiments, which will be described below, relate to a workpiece supporting apparatus and a workpiece supporting method.

In an embodiment, there is provided a workpiece supporting apparatus comprising: a Bernoulli chuck configured to generate a suction force by emitting a gas; and a liquid ejection member surrounding the Bernoulli chuck and configured to discharge a liquid around the Bernoulli chuck.

In an embodiment, the liquid ejection member has a plurality of liquid ejecting openings arranged around the Bernoulli chuck.

In an embodiment, the Bernoulli chuck includes a plurality of gas jet openings facing outward in radial directions of the Bernoulli chuck, and the plurality of gas jet openings are arranged to emit a gas radially.

In an embodiment, the plurality of liquid ejecting openings are located on a plurality of straight lines extending from the center of the Bernoulli chuck through the plurality of gas jet openings when viewed from above the liquid ejection member.

In an embodiment, the liquid ejection member includes a side wall surrounding the Bernoulli chuck, a bottom portion coupled to the side wall, and a liquid ejecting opening facing an outer surface of the Bernoulli chuck, and the liquid ejecting opening is located such that when a liquid is discharged from the liquid ejecting opening, the liquid flows from a gap between the Bernoulli chuck and the liquid ejection member outwardly along a surface of the workpiece.

In an embodiment, the liquid ejecting opening is located in the bottom portion.

In an embodiment, the liquid ejecting opening is located in an inner surface of the side wall.

In an embodiment, the Bernoulli chuck has a gas jet opening configured to emit the gas; and the gas jet opening faces in a direction inclined with respect to a radial direction of the Bernoulli chuck when viewed from above the Bernoulli chuck to form a swirling flow of the gas.

In an embodiment, there is provided a workpiece processing apparatus comprising: a processing head configured to process a workpiece; and the above workpiece supporting apparatus configured to support the workpiece.

In an embodiment, there is provided a workpiece transporting apparatus comprising: the above workpiece supporting apparatus configured to support a workpiece; and a moving device configured to move the workpiece supporting apparatus.

In an embodiment, there is provided a workpiece supporting method comprising: supporting a workpiece by flow of gas, while sucking the workpiece by a suction force generated by emitting the gas from a Bernoulli chuck; and discharging a liquid around the Bernoulli chuck from a liquid ejection member surrounding the Bernoulli chuck.

In an embodiment, the liquid flows outward along a surface of the workpiece from a plurality of liquid ejecting openings arranged around the Bernoulli chuck.

In an embodiment, the gas is emitted radially outwardly from a plurality of gas jet openings of the Bernoulli chuck.

In an embodiment, the plurality of liquid ejecting openings are located on a plurality of straight lines extending from the center of the Bernoulli chuck through the plurality of gas jet openings when viewed from above the liquid ejection member.

In an embodiment, the liquid flows from a gap between the Bernoulli chuck and the liquid ejection member outwardly along a surface of the workpiece.

In an embodiment, the gas is emitted from a gas jet opening of the Bernoulli chuck to form a swirling flow.

In an embodiment, there is provided a workpiece processing method comprising: supporting a workpiece by flow of gas, while sucking the workpiece by a suction force generated by emitting the gas from a Bernoulli chuck; and discharging a liquid around the Bernoulli chuck from a liquid ejection member surrounding the Bernoulli chuck; and processing a processing point of the workpiece, while supplying the liquid to the processing point of the workpiece.

According to the above-described embodiments, the liquid is supplied to the surface of the workpiece while maintaining the suction force on the workpiece generated by the Bernoulli chuck, thereby preventing the workpiece from drying out.

DESCRIPTION OF EMBODIMENTS

Figure 1:
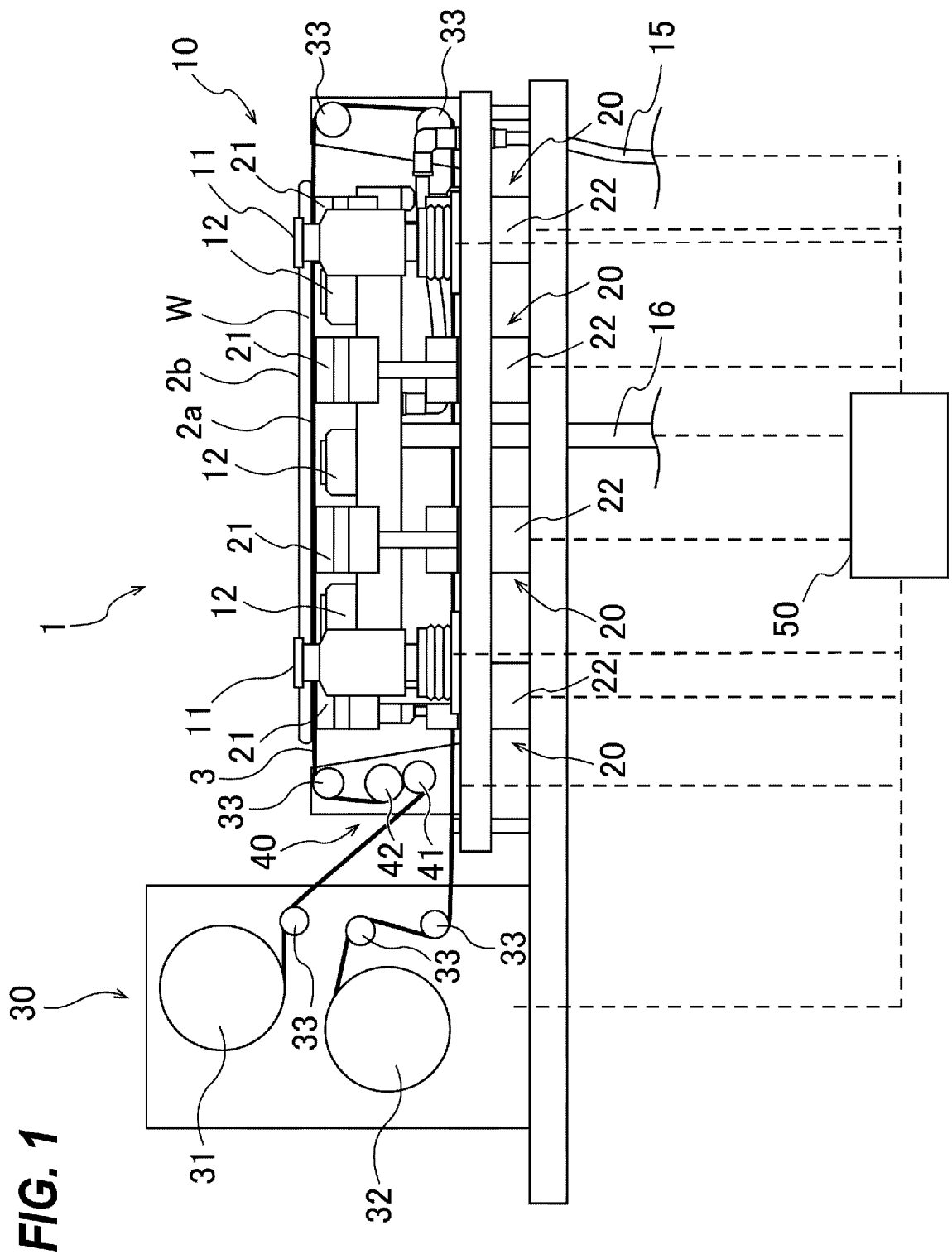
FIG. 1 is a schematic diagram showing an embodiment of a polishing apparatus.

Embodiments will now be described with reference to the drawings. FIG. 1 is a schematic diagram showing an embodiment of a polishing apparatus 1. The polishing apparatus 1 shown in FIG. 1 includes a workpiece holder 10 configured to hold a wafer W (which is an example of a workpiece) and rotate the wafer W about its central axis, polishing heads 20 configured to polish a first surface 2a of the wafer W by bringing a polishing tape 3 as a polishing tool into contact with the first surface 2a of the wafer W held by the workpiece holder 10, and a polishing-tape supply mechanism 30 configured to supply the polishing tape 3 to the polishing heads 20. Each polishing head 20 is an example of a processing head configured to process the surface of the wafer W.

The workpiece holder 10 includes a plurality of rollers 11 capable of contacting the peripheral portion of the wafer W, and a plurality of workpiece supporting apparatuses 12 configured to support the first surface (or a lower surface) 2a of the wafer W with a fluid. The workpiece holder 10 includes a roller rotating mechanism (not shown) for rotating each roller 11 about the central axis of the roller 11. The details of the workpiece supporting apparatuses 12 will be described later.

In this embodiment, the first surface 2a of the wafer W is a back surface of the wafer W on which no device is formed or no device is to be formed, i.e., a non-device surface. A second surface 2b of the wafer W opposite to the first surface 2a is a surface on which devices are formed or devices are to be formed, i.e., a device surface. In this present embodiment, the wafer W is horizontally supported by the workpiece holder 10 with the first surface 2a facing downward.

The polishing heads 20 are disposed below the wafer W held by the workpiece holder 10. Each of the polishing heads 20 includes a pressing member 21 configured to press the polishing tape 3 against the first surface 2a of the wafer W, and a pressing mechanism 22 configured to push up the pressing member 21 upward. The pressing mechanism 22 pushes up the pressing member 21 upward, so that the pressing member 21 presses the polishing tape 3 from its back side against the first surface 2a of the wafer W to thereby polish the first surface 2a of the wafer W.

The polishing-tape supply mechanism 30 includes a tape feeding reel 31 to which one end of the polishing tape 3 is connected, a tape take-up reel 32 to which the other end of the polishing tape 3 is connected, a tape-advancing device 40 configured to advance the polishing tape 3 in its longitudinal direction, and a plurality of guide rollers 33 for guiding the moving direction of the polishing tape 3. The tape-advancing device 40 includes a tape-advancing roller 41 coupled to a tape-advancing motor (not shown), and a nip roller 42 configured to press the polishing tape 3 against the tape-advancing roller 41. The polishing tape 3 is sandwiched between the tape-advancing roller 41 and the nip roller 42. When the tape-advancing motor rotates the tape-advancing roller 41, the polishing tape 3 advances in the longitudinal direction thereof. More specifically, the polishing tape 3 advances from the tape feeding reel 31 to the tape take-up reel 32 via the polishing heads 20. The plurality of guide rollers 33 guide the polishing tape 3 so that the polishing tape 3 advances in a direction parallel to the first surface 2a of the wafer W.

The tape feeding reel 31 and the tape take-up reel 32 are coupled to motors (not shown), respectively. These motors apply torques to the tape feeding reel 31 and the tape take-up reel 32 to rotate in opposite directions, thereby applying tension to the polishing tape 3.

In one embodiment, the polishing-tape supply mechanism 30 is not limited to the above-described configuration, and may include the tape feeding reel 31, the tape take-up reel 32, and the plurality of guide rollers 33 without the tape-advancing device 40. For example, when the tape take-up reel 32 is rotated by a motor (not shown), the polishing tape 3 may advance from the tape feeding reel 31 to the tape take-up reel 32 via the polishing heads 20. The plurality of guide rollers 33 guide the polishing tape 3 so that the polishing tape 3 advances in a direction parallel to the first surface 2a of the wafer W. The positions of the tape feeding reel 31 and the tape take-up reel 32 may be reversed.

The operation of the polishing apparatus 1 is controlled by an operation controller 50. The operation controller 50 is electrically connected to the workpiece holder 10, the polishing heads 20, and the polishing-tape supply mechanism 30. The operations of the rollers 11 and the workpiece supporting apparatuses 12 of the workpiece holder 10, the polishing heads 20, and the polishing-tape supply mechanism 30 are controlled by the operation controller 50. The operation controller 50 is constituted by at least one computer.

Figure 2:
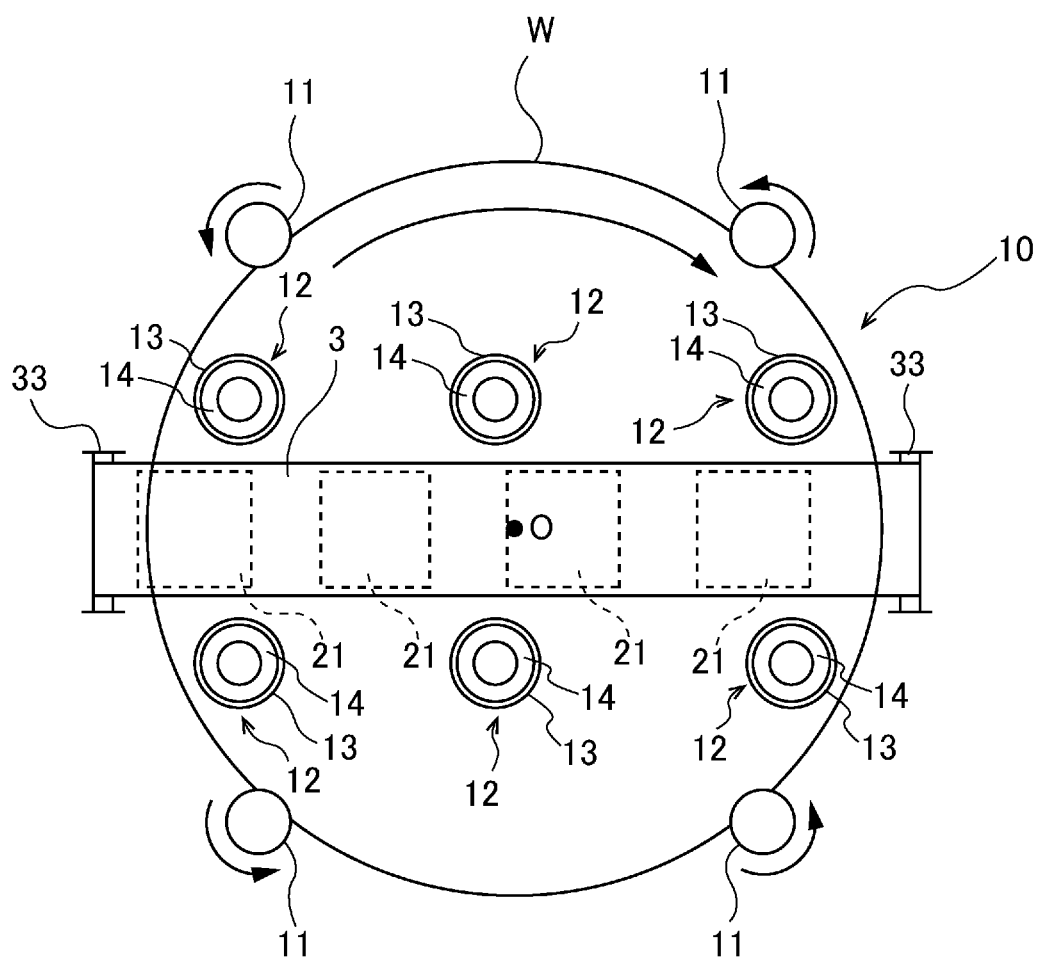
FIG. 2 is a plan view showing a state in which a workpiece holder supports a wafer.

FIG. 2 is a plan view showing a state in which the workpiece holder 10 supports the wafer W. In FIG. 2, the peripheral portion of the wafer W is held by four rollers 11, and the first surface 2a of the wafer W is supported by six workpiece supporting apparatuses 12. The four rollers 11 are arranged around a reference central point O of the workpiece holder 10. The roller rotating mechanism (not shown) is configured to rotate the four rollers 11 in the same direction and at the same speed. During polishing of the first surface 2a of the wafer W, the peripheral portion of the wafer W is held by the rollers 11. The wafer W is horizontally held, and the wafer W is rotated about its central axis by the rotation of the rollers 11. During polishing of the first surface 2a of the wafer W, the four rollers 11 rotate about their respective central axes, while the positions of the rollers 11 themselves are fixed. Although the number of rollers 11 is four in this embodiment, the number of rollers is not limited to this embodiment. Five or more rollers may be provided. In one embodiment, the wafer W may be held by the plurality of rollers 11 such that the wafer W is inclined with respect to the horizontal direction.

The wafer W is further supported by the plurality of workpiece supporting apparatuses 12. These workpiece supporting apparatuses 12 are arranged at both sides of the polishing tape 3 and the pressing members 21. Three workpiece supporting apparatuses 12, which are arranged at one side of the polishing tape 3 supported by the pressing members 21, are arranged along the polishing tape 3. Similarly, the other three workpiece supporting apparatuses 12, which are arranged at the other side of the polishing tape 3 supported by the pressing members 21, are arranged along the polishing tape 3. The six workpiece supporting apparatuses 12 are separated from, but in close proximity to, the polishing tape 3 and the pressing members 21. Although the number of workpiece supporting apparatuses 12 is six in this embodiment, the number and positions of the workpiece supporting apparatuses 12 are not limited to this embodiment. Only one workpiece supporting apparatus 12 may be provided.

Each of the workpiece supporting apparatuses 12 includes a liquid ejection member 13 and a Bernoulli chuck 14. The Bernoulli chuck 14 is configured to suck the first surface 2a of the wafer W by flow of a gas, and support the first surface 2a in a non-contact manner. In this specification, the Bernoulli chuck 14 is defined as a chuck configured to eject a gas to generate a suction force utilizing Bernoulli's theorem.

Figure 3A:
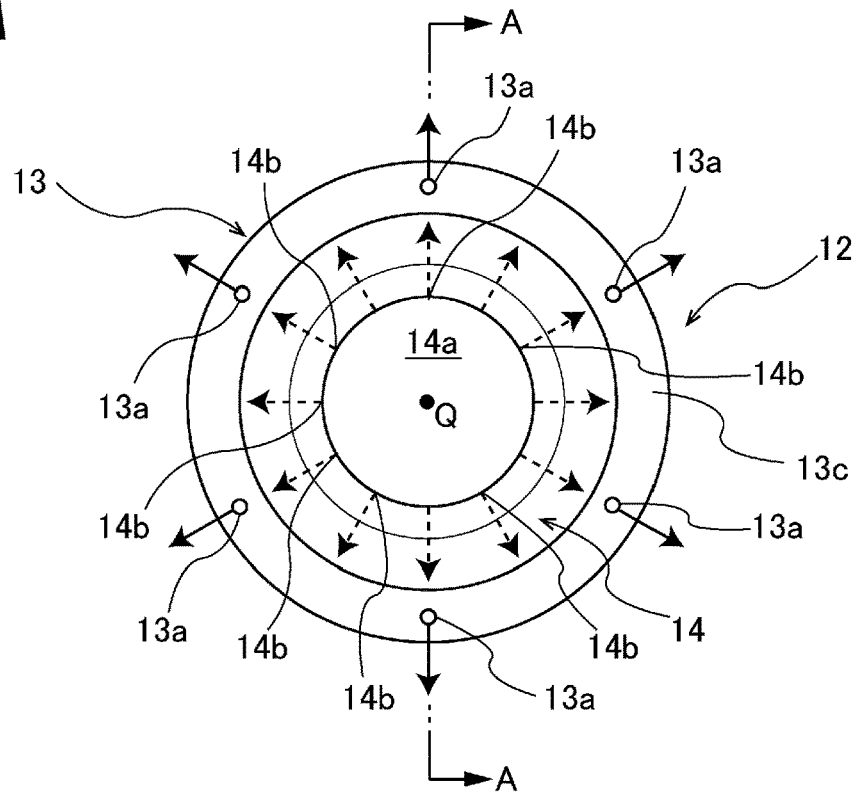
FIG. 3A is a plan view showing an embodiment of a workpiece supporting apparatus.
Figure 3B:
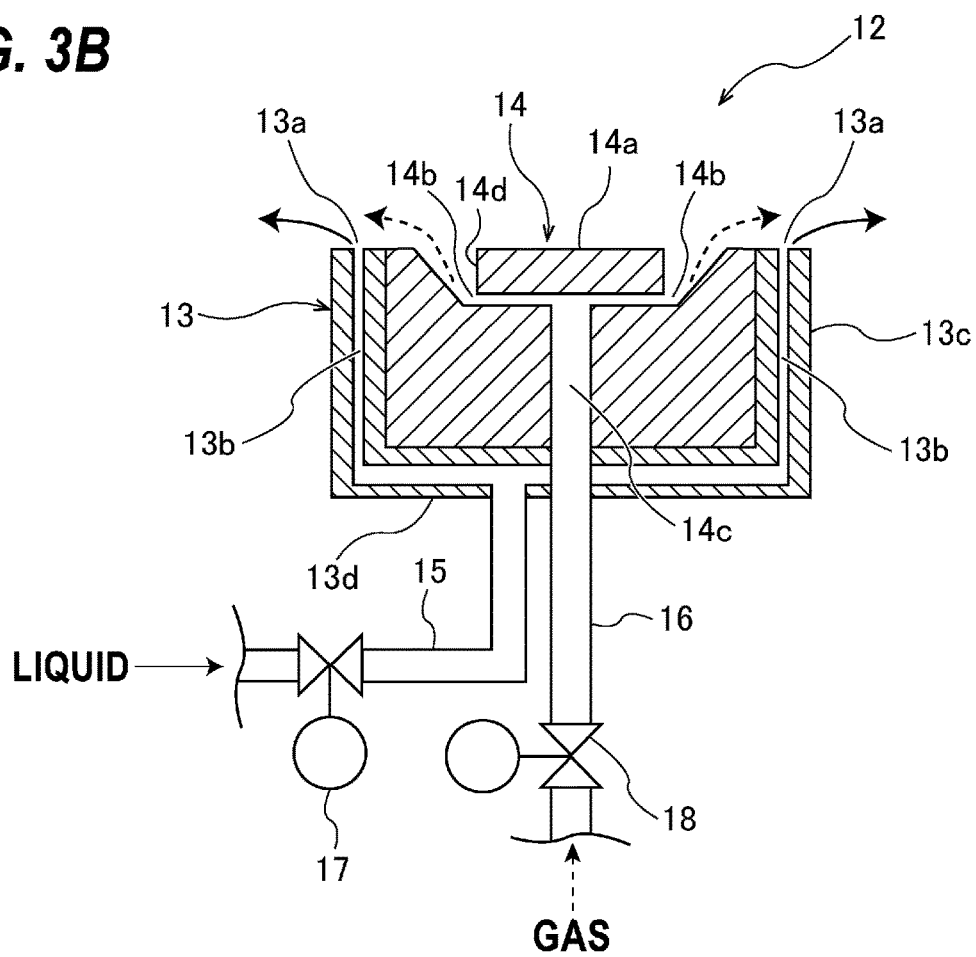
FIG. 3B is a cross-sectional view taken along a line A-A of FIG. 3A.

The details of each workpiece supporting apparatus 12 will now be described. FIG. 3A is a plan view showing an embodiment of the workpiece supporting apparatus 12, and FIG. 3B is a cross-sectional view taken along a line A-A of FIG. 3A. Each workpiece supporting apparatus 12 includes the liquid ejection member 13 and the Bernoulli chuck 14. The liquid ejection member 13 is located so as to surround the Bernoulli chuck 14. The liquid ejection member 13 has a plurality of liquid ejecting openings 13a, a plurality of liquid flow passages 13b, a side wall 13c surrounding the Bernoulli chuck 14, and a bottom portion 13d connected to the side wall 13c. The inner diameter of the side wall 13c is larger than the outer diameter of the Bernoulli chuck 14, and the Bernoulli chuck 14 is located inside the liquid ejection member 13.

The liquid ejecting openings 13a are a plurality of holes formed in an upper surface of the liquid ejection member 13. These liquid ejecting openings 13a are located on the same circumference at equal intervals when viewed from above the liquid ejection member 13. The liquid ejecting openings 13a are formed in the upper surface of the side wall 13c, and are arranged around the Bernoulli chuck 14.

The liquid flow passages 13b extend in the side wall 13c downward from the liquid ejecting openings 13a toward the bottom portion 13d, further extend in the bottom portion 13d, and join at a central portion of the bottom portion 13d. The liquid flow passages 13b communicate with a liquid supply line 15 for supplying liquid to the liquid ejection member 13. A liquid supply valve 17 is attached to the liquid supply line 15, and the liquid supply valve 17 is electrically connected to the operation controller 50. The operation of the liquid supply valve 17 is controlled by the operation controller 50. Examples of the liquid supply valve 17 include an actuator-driven valve, such as an electric-motor driven valve and a solenoid valve.

The Bernoulli chuck 14 has a suction surface 14a facing upward. This suction surface 14a faces the first surface (or the lower surface) 2a of the wafer W. The Bernoulli chuck 14 has a plurality of gas jet openings 14b located around the suction surface 14a, and a gas flow passage 14c communicating with these gas jet openings 14b.

The gas jet openings 14b are formed in a wall surface 14d extending downward from the suction surface 14a of the Bernoulli chuck 14. These gas jet openings 14b face radially outwardly. As shown in FIG. 3A, the gas jet openings 14b are located on the same circumference at equal intervals when viewed from above the Bernoulli chuck 14. The liquid ejecting openings 13a of the liquid ejection member 13 are located on straight lines extending from the center Q of the Bernoulli chuck 14 through the gas jet openings 14b when viewed from above the liquid ejection member 13.

The gas flow passage 14c has a plurality of branch flow passages extending from the gas jet openings 14b in the radially-inward directions of the Bernoulli chuck 14, and these branch flow passages join at the central portion of the Bernoulli chuck 14. The gas flow passage 14c communicates with a gas supply line 16 for supplying gas (e.g., dry air, inert gas, etc.) to the Bernoulli chuck 14. A gas supply valve 18 is attached to the gas supply line 16, and the gas supply valve 18 is electrically connected to the operation controller 50. An operation of the gas supply valve 18 is controlled by the operation controller 50. Examples of the gas supply valve 18 include an actuator-driven valve, such as an electric-motor driven valve and a solenoid valve.

When the operation controller 50 opens the liquid supply valve 17 and the gas supply valve 18, the liquid is supplied to the liquid ejection member 13, and the gas is supplied to the Bernoulli chuck 14. The liquid supplied to the liquid ejection member 13 flows through the liquid flow passages 13b and is ejected from the plurality of liquid ejecting openings 13a toward the outside of the liquid ejection member 13. The gas supplied to the Bernoulli chuck 14 flows through the gas flow passage 14c and is emitted radially from the plurality of gas jet openings 14b toward the outside of the Bernoulli chuck 14. In FIGS. 3A and 3B, arrows of solid lines represent flows of the liquid, and arrows of dashed lines represent flows of the gas.

In this embodiment, six liquid ejecting openings 13a and twelve gas jet openings 14b are provided. However, the number and positions of the liquid ejecting openings 13a and the gas jet openings 14b shown in FIGS. 3A and 3B are examples, and are not limited particularly.

In this embodiment, the liquid ejection member 13 has the side wall 13c surrounding the Bernoulli chuck 14, but the liquid ejection member 13 is not limited to this embodiment as long as the liquid ejection member 13 is configured to emit the liquid around the Bernoulli chuck 14. For example, the liquid ejection member 13 may not have the side wall 13c, and may instead include a plurality of liquid nozzles configured to emit the liquid around the Bernoulli chuck 14.

Figure 4:
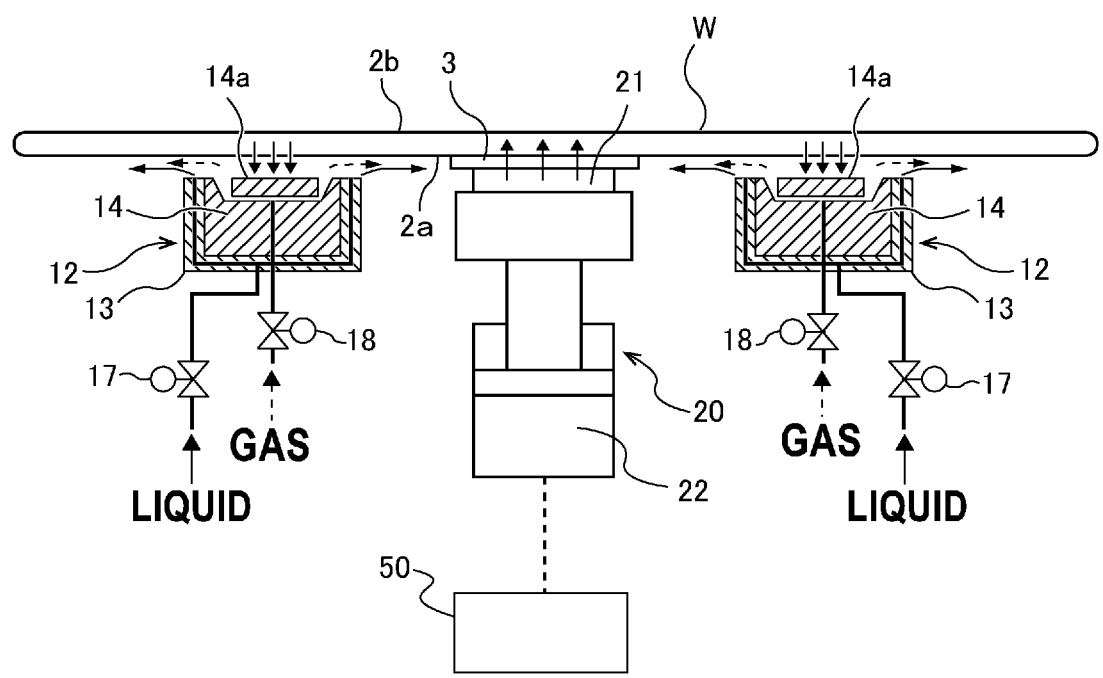
FIG. 4 is a schematic diagram showing a state in which the workpiece supporting apparatuses shown in FIGS. 3A and 3B support a lower surface of the wafer.

FIG. 4 is a schematic diagram showing a state in which the workpiece supporting apparatuses 12 shown in FIGS. 3A and 3B support the lower surface of the wafer W. The workpiece supporting apparatuses 12 are disposed below the wafer W. When the operation controller 50 opens each gas supply valve 18, the gas flows through the gas supply line 16, and is supplied to each Bernoulli chuck 14, and is jetted from the Bernoulli chuck 14 to the outside. The gas flow spreading outward from the suction surface 14a forms a negative pressure in a space between the central portion of the suction surface 14a and the first surface 2a of the wafer W. As a result, each Bernoulli chuck 14 generates the suction force at the center portion of the suction surface 14a to suck the wafer W. A gas flow is formed in a space between an outer peripheral portion of the Bernoulli chuck 14 and the first surface 2a of the wafer W, and this gas flow supports the first surface 2a of the wafer W. In this way, the Bernoulli chucks 14 can support the wafer W in a non-contact manner while sucking the wafer W. Therefore, while the Bernoulli chucks 14 support the wafer W, the rollers 11 of the workpiece holder 10 can rotate the wafer W.

When the polishing tape 3 is pressed against the first surface 2a of the wafer W to polish the first surface 2a of the wafer W, a polishing load is applied upward to the wafer W. In this embodiment, the wafer W is subjected to the downward suction forces by the Bernoulli chucks 14. Such downward suction forces cancel out the upward polishing load applied to the wafer W. Therefore, the polishing heads 20 can apply the polishing load to the first surface 2a of the wafer W, while suppressing the wafer W from bending upward. Further, since the wafer W is sucked by the suction surfaces 14a of the Bernoulli chucks 14 in a non-contact manner, the first surface 2a of the wafer W can be kept clean.

The liquid is discharged from the liquid ejection member 13, while the Bernoulli chuck 14 sucks the first surface 2a of the wafer W in a non-contact manner. Due to the outward flow of the gas from Bernoulli chuck 14, the liquid flows outward from around the Bernoulli chuck 14 along the first surface 2a of the wafer W. Since the wafer W is rotating, a portion of the wafer W that has been in contact with the gas flow immediately contacts the liquid, and therefore that portion of the wafer W is prevented from drying out. Further, as shown in FIG. 4, by arranging the workpiece supporting apparatus 12 near the pressing member 21, the liquid discharged from the liquid ejection member 13 can be supplied to a processing point (or a polishing point) of the wafer W. As a result, polishing debris produced by the polishing process can be effectively removed.

Figure 5A:
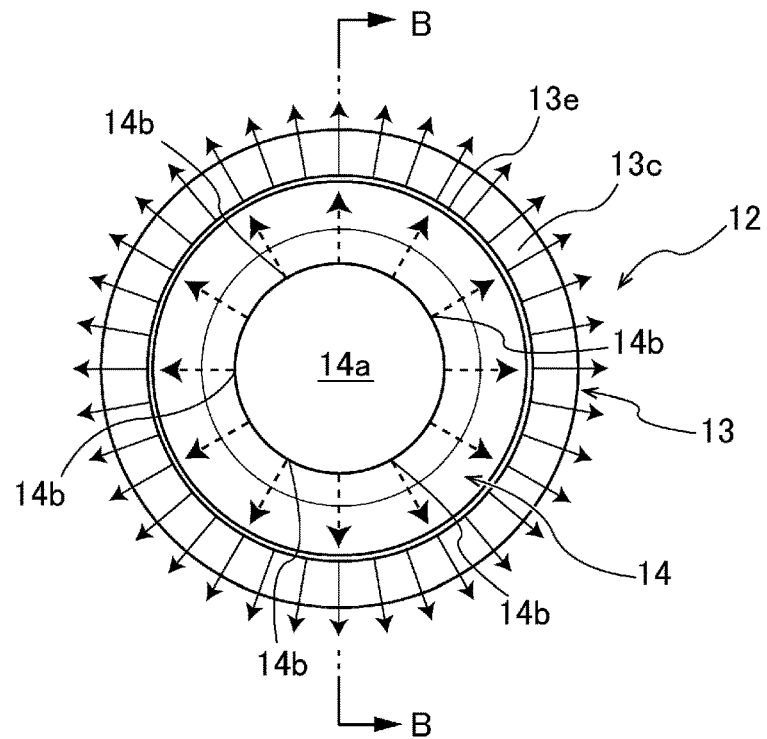
FIG. 5A is a plan view showing another embodiment of the workpiece supporting apparatus.
Figure 5B:
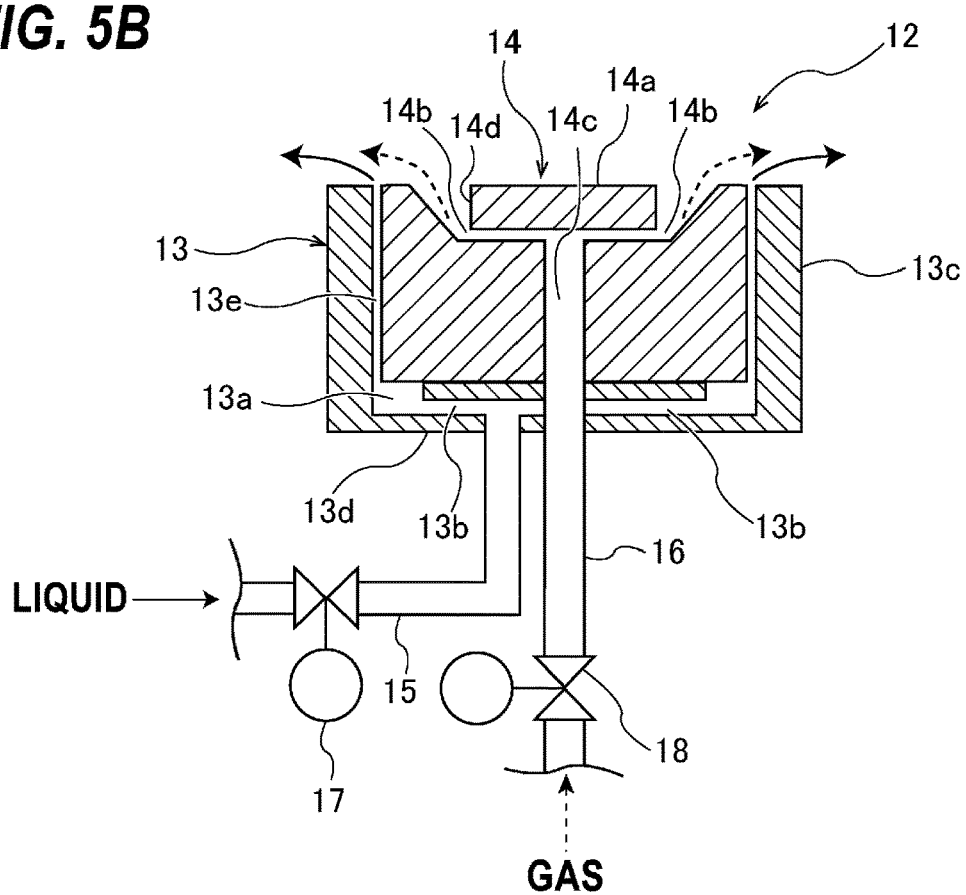
FIG. 5B is a cross-sectional view taken along a line B-B of FIG. 5A.

FIG. 5A is a plan view showing another embodiment of the workpiece supporting apparatus 12, and FIG. 5B is a sectional view taken along a line B-B of FIG. 5A. Configurations of this embodiment, which will not be particularly described, are the same as those of the above-described embodiment described with reference to FIGS. 3A and 3B, and duplicated description thereof will be omitted.

The liquid ejection member 13 is located so as to surround the Bernoulli chuck 14. The inner diameter of the liquid ejection member 13 is larger than the outer diameter of the Bernoulli chuck 14, and a gap 13e is formed between the side wall 13c of the liquid ejection member 13 and an outer wall of the Bernoulli chuck 14. The height of the upper surface of the liquid ejection member 13 when the Bernoulli chuck 14 is located inside the liquid ejection member 13 may be lower than or the same as the height of the upper surface of the Bernoulli chuck 14.

The liquid ejecting opening 13a faces an outer surface of the Bernoulli chuck 14. More specifically, the liquid ejecting opening 13a faces the outer surface of the bottom portion of the Bernoulli chuck 14. The plurality of liquid flow passages 13b extending radially outwardly from the central portion of the liquid ejection member 13 are formed in the bottom portion 13d of the liquid ejection member 13. The liquid flow passages 13b communicate with the liquid supply line 15 for supplying the liquid to the liquid ejection member 13. The liquid ejecting opening 13a has an annular shape along the outer circumference of the bottom portion 13d. The annular liquid ejecting opening 13a communicates with the liquid flow passages 13b at the bottom portion 13d, and is located radially outwardly of the liquid flow passages 13b. However, the shape of the liquid ejecting opening 13a is not limited to this embodiment. For example, a plurality of liquid ejecting openings 13a coupled to the plurality of liquid flow passages 13b, respectively, may be provided.

Configuration of the Bernoulli chuck 14 is the same as that of the embodiment shown in FIGS. 3A and 3B. When the operation controller 50 opens the liquid supply valve 17 and the gas supply valve 18, the liquid is supplied to the liquid ejection member 13 and the gas is supplied to the Bernoulli chuck 14. The liquid supplied to the liquid ejection member 13 flows through the liquid flow passages 13b and is discharged from the liquid ejecting opening 13a, and flows upward through the gap 13e. Further, the liquid is discharged from the gap 13e toward the outside of the liquid ejection member 13 along the first surface 2a of the wafer W. The gas supplied to the Bernoulli chuck 14 flows through the gas flow passage 14c and is emitted radially from the plurality of gas jet openings 14b toward the outside of the Bernoulli chuck 14. In FIGS. 5A and 5B, arrows of solid lines represent flows of the liquid, and arrows of dashed lines represent flows of the gas. The number and positions of the liquid ejecting opening 13a and the gas jet openings 14b shown in FIGS. 5A and 5B are examples, and are not limited particularly.

Figure 6A:
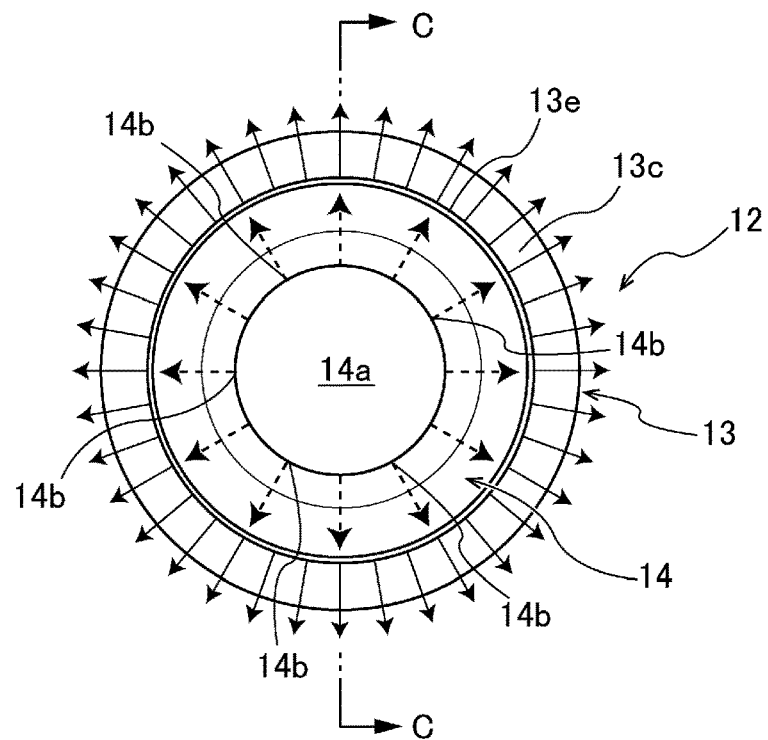
FIG. 6A is a plan view showing still another embodiment of the workpiece supporting apparatus.
Figure 6B:
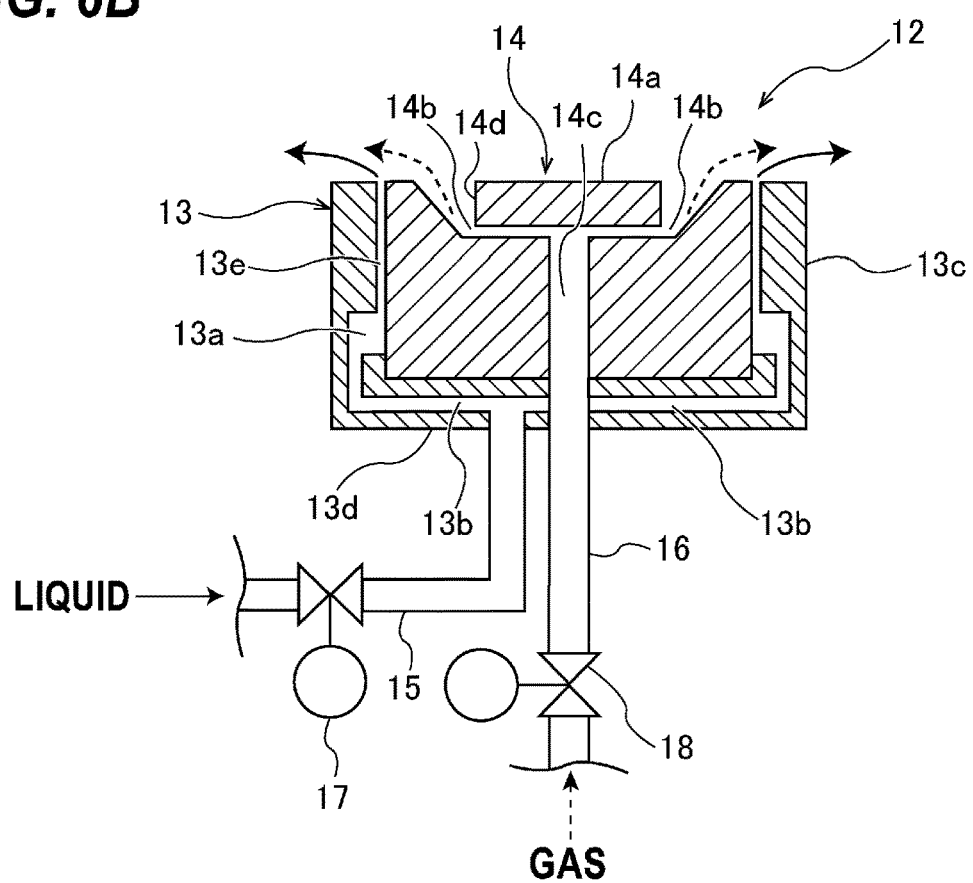
FIG. 6B is a cross-sectional view taken along a line C-C of FIG. 6A.

FIG. 6A is a plan view showing still another embodiment of the workpiece supporting apparatus 12, and FIG. 6B is a cross-sectional view taken along a line C-C of FIG. 6A. In the embodiment shown in FIGS. 6A and 6B, the position of the liquid ejecting opening 13a is different from that of the embodiment described with reference to FIGS. 5A and 5B. Specifically, the liquid ejecting opening 13a is located in an inner surface of the side wall 13c. The liquid ejecting opening 13a of this embodiment is also in an annular shape. However, the shape of the liquid ejecting opening 13a is not limited to the annular shape. For example, a plurality of liquid ejecting openings 13a may be formed in the inner surface of the side wall 13c so as to surround the Bernoulli chuck 14. Since the configurations and operations of the embodiment shown in FIGS. 6A and 6B, except for the liquid ejection member 13, are the same as those of the embodiment described with reference to FIGS. 5A and 5B, repetitive descriptions will be omitted.

Figure 7A:
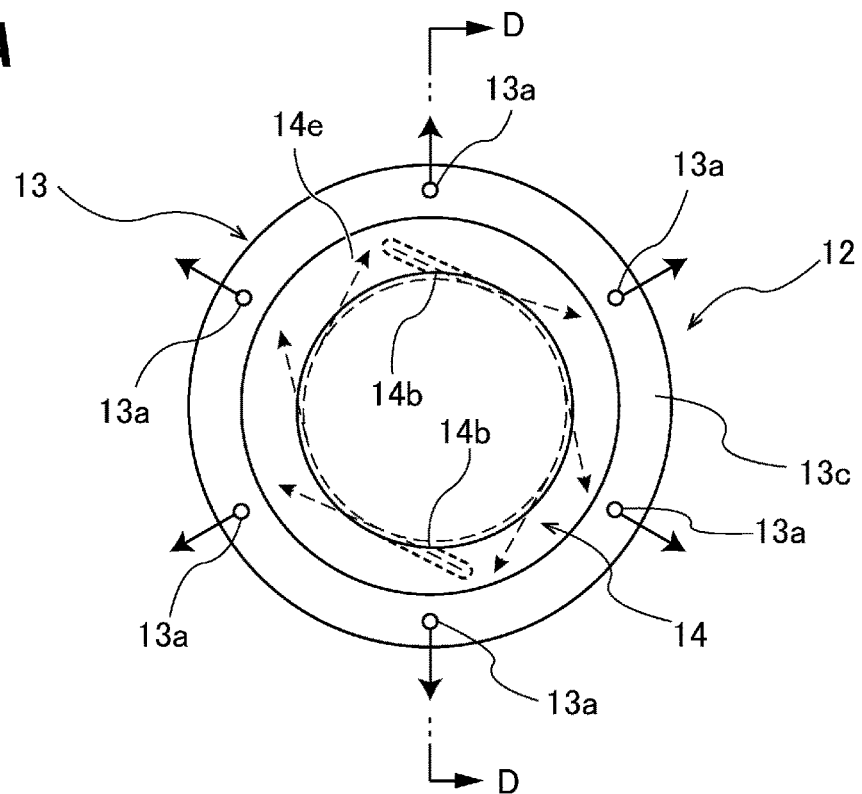
FIG. 7A is a plan view showing still another embodiment of the workpiece supporting apparatus.
Figure 7B:
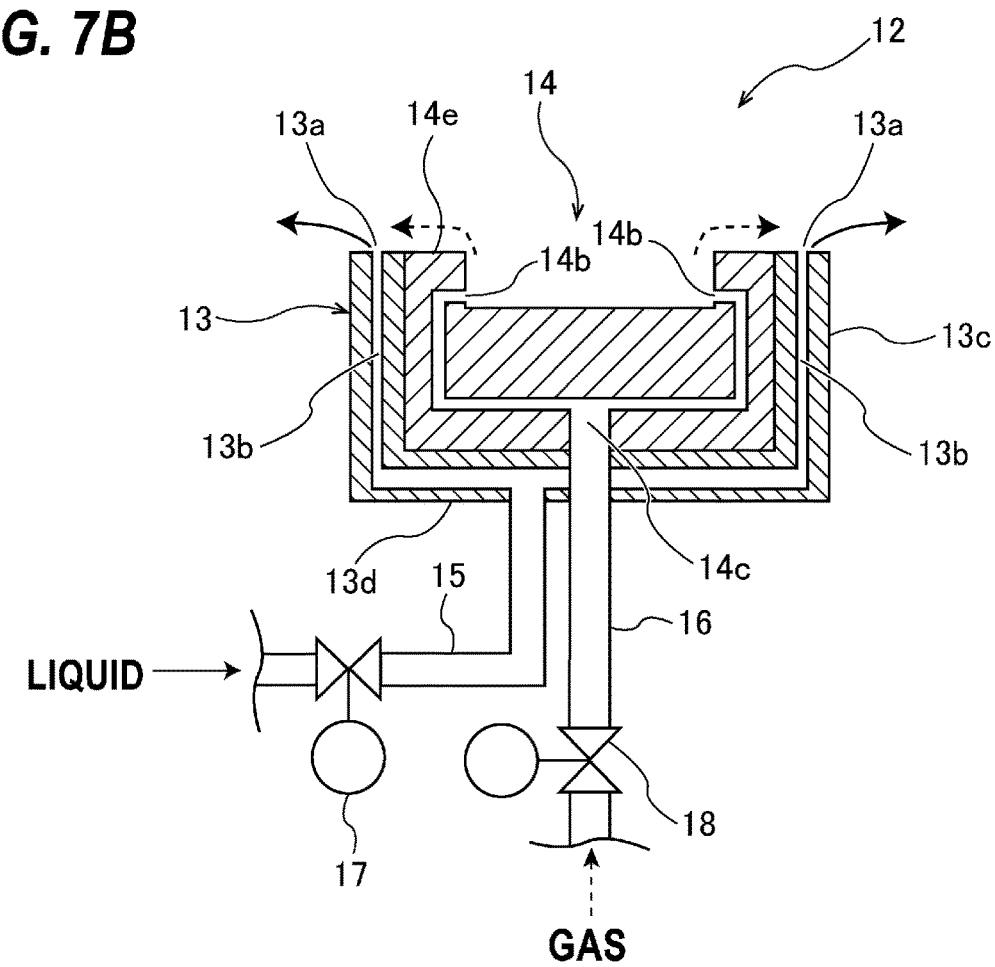
FIG. 7B is a cross-sectional view taken along a line D-D of FIG. 7A.

FIG. 7A is a plan view showing still another embodiment of the workpiece supporting apparatus 12, and FIG. 7B is a cross-sectional view taken along a line D-D of FIG. 7A. Configurations of this embodiment, which will not be particularly described, are the same as those of the above-described embodiment described with reference to FIGS. 3A and 3B, and duplicated description thereof will be omitted.

Configuration of the liquid ejection member 13 is the same as that of the embodiment described with reference to FIGS. 3A and 3B. The Bernoulli chuck 14 has gas jet openings 14b and gas flow passage 14c. The gas jet openings 14b are formed in an inner circumferential surface of a side wall 14e of the Bernoulli chuck 14. The gas jet openings 14b are arranged at equal intervals along the inner circumferential surface of the side wall 14e. Each gas jet opening 14b faces in a direction inclined with respect to the radial direction of the Bernoulli chuck 14 when viewed from above the Bernoulli chuck 14. Each gas jet opening 14b communicates with the gas flow passage 14c. The gas flow passage 14c communicates with the gas supply line 16 for supplying the gas to the Bernoulli chuck 14. The gas supply valve 18 is attached to the gas supply line 16, and the gas supply valve 18 is electrically connected to the operation controller 50. An operation of the gas supply valve 18 is controlled by the operation controller 50.

When the operation controller 50 opens the liquid supply valve 17 and the gas supply valve 18, the liquid is supplied to the liquid ejection member 13 and the gas is supplied to the Bernoulli chuck 14. The liquid supplied to the liquid ejection member 13 flows through the liquid flow passages 13b and is discharged from the plurality of liquid ejecting openings 13a toward the outside of the liquid ejection member 13. The gas supplied to the Bernoulli chuck 14 flows through the gas flow passage 14c and is emitted from the plurality of gas jet openings 14b to form a swirling flow of gas along the inner circumferential surface of the side wall 14e. Further, the gas forming the swirling flow flows to the outside of the Bernoulli chuck 14. In FIGS. 7A and 7B, arrows of solid lines represent flows of the liquid, and arrows of dashed lines represent flows of the gas. The number and positions of the liquid ejecting opening 13a and the gas jet openings 14b shown in FIGS. 7A and 7B are examples, and are not limited particularly.

Figure 8A:
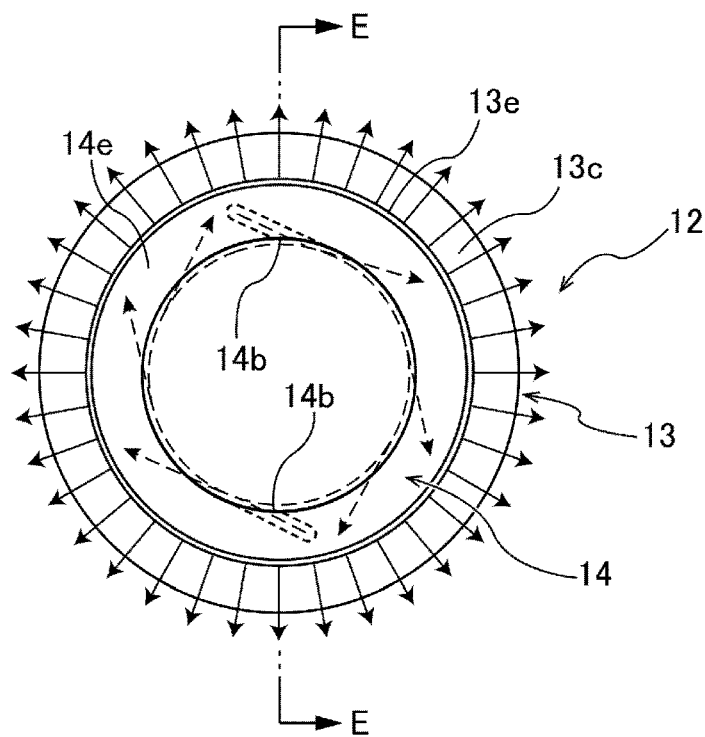
FIG. 8A is a plan view showing still another embodiment of the workpiece supporting apparatus.
Figure 8B:
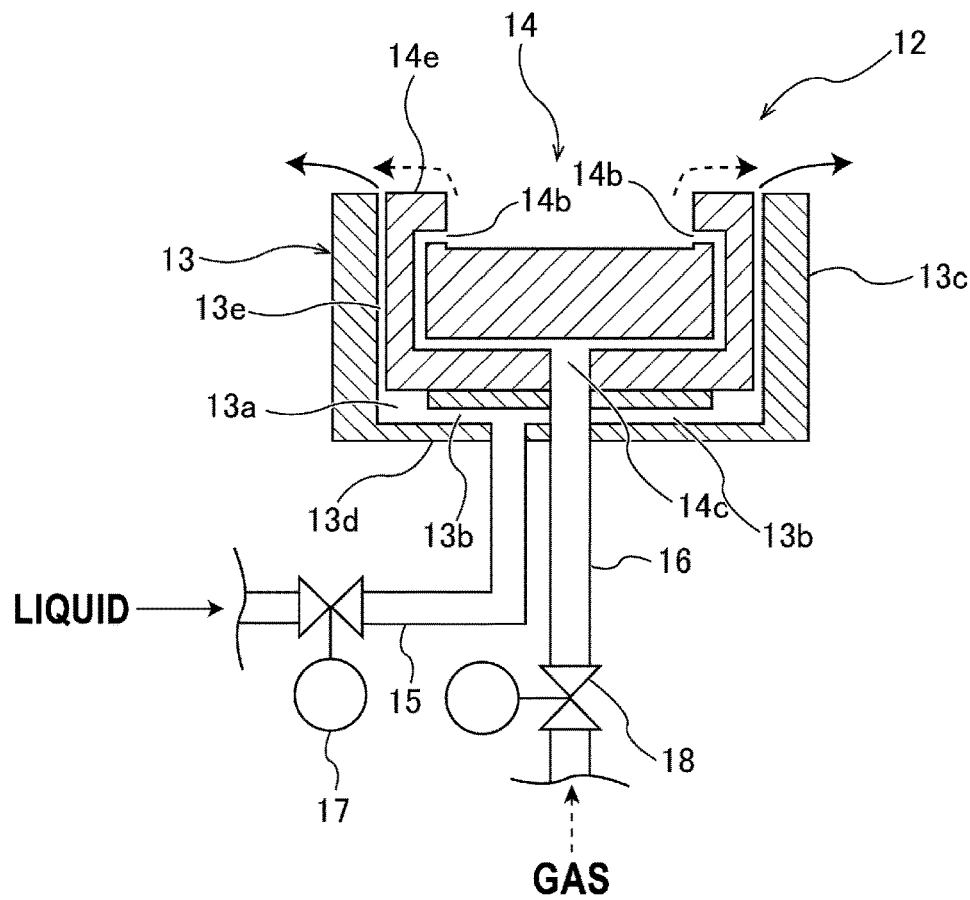
FIG. 8B is a cross-sectional view taken along a line E-E of FIG. 8A.

FIG. 8A is a plan view showing still another embodiment of the workpiece supporting apparatus 12, and FIG. 8B is a cross-sectional view taken along a line E-E of FIG. 8A. Configurations of this embodiment, which will not be particularly described, are the same as those of the above-described embodiment described with reference to FIGS. 5A and 5B, and duplicated description will be omitted. In this embodiment, configuration of the liquid ejection member 13 is the same as that of the embodiment described with reference to FIGS. 5A and 5B, and configuration of the Bernoulli chuck 14 is the same as that of the embodiment described with reference to FIGS. 7A and 7A.

When the operation controller 50 opens the liquid supply valve 17 and the gas supply valve 18, the liquid is supplied to the liquid ejection member 13 and the gas is supplied to the Bernoulli chuck 14. The liquid supplied to the liquid ejection member 13 flows through the liquid flow passages 13b and is discharged from the liquid ejecting opening 13a and further flows upward through the gap 13e. Further, the liquid is discharged from the gap 13e, and flows toward the outside of the liquid ejection member 13 along the first surface 2a of the wafer W. The gas supplied to the Bernoulli chuck 14 flows through the gas flow passage 14c and is emitted from the plurality of gas jet openings 14b to form a swirling flow of the gas along the inner circumferential surface of the side wall 14e. Further, the gas forming the swirling flow flows to the outside of the Bernoulli chuck 14. In FIGS. 8A and 8B, arrows of solid lines represent flows of the liquid, and arrows of dashed lines represent flows of the gas. The number and positions of the liquid ejecting opening 13a and the gas jet openings 14b shown in FIGS. 8A and 8B are examples, and are not limited particularly. Configuration of the liquid ejection member 13 may be the same as that of the embodiment described with reference to FIGS. 6A and 6B.

In order to more effectively exert the suction force on the wafer W by the Bernoulli chuck 14, as shown in FIGS. 3A and 3B, it is preferable that the liquid ejecting openings 13a are located on a plurality of straight lines extending from the center Q of the Bernoulli chuck 14 through the plurality of gas jet openings 14b when viewed from above the liquid ejection member 13. Experiments have confirmed the fact that such arrangement increases the suction force on the wafer W by the Bernoulli chuck 14.

In the above-described embodiments, the workpiece supporting apparatuses 12 of the polishing apparatus 1 for polishing the wafer W has been described, but the present invention is not limited these embodiments. The present invention is applicable to all workpiece processing apparatuses. Another example of the workpiece processing apparatus is a cleaning apparatus for cleaning a workpiece, such as a wafer. Specific examples of the processing head of the cleaning apparatus include a cleaning tool, such as a roll sponge and a pen-type sponge.

Figure 9:
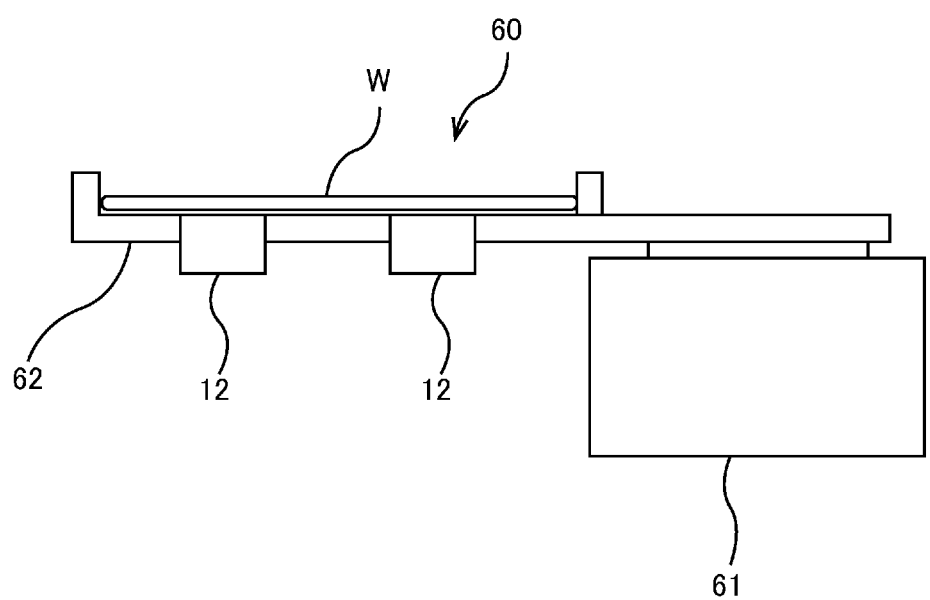
FIG. 9 is a schematic diagram showing an embodiment of a workpiece transporting apparatus.

FIG. 9 is a schematic diagram showing an embodiment of a workpiece transporting apparatus 60. The present invention is also applicable to the workpiece transporting apparatus 60 as shown in FIG. 9. The workpiece transporting apparatus 60 includes a hand 62, a moving device 61, and workpiece supporting apparatuses 12. The workpiece supporting apparatuses 12 are fixed to the hand 62. The hand 62 is configured to support a peripheral portion of a wafer W, which is an example of a workpiece. Further, one surface of the wafer W is supported in a non-contact state by the workpiece supporting apparatuses 12 according to any one of the embodiments described with reference to FIGS. 3, 5 to 8. The workpiece transporting apparatus 60 can transport the wafer W by moving the hand 62 and the workpiece supporting apparatuses 12 by the moving device 61.

In the above-described embodiments, the wafer W has been described as an example of the workpiece, but the present invention is not limited to the wafer. Other examples of workpiece include a square substrate and a liquid crystal panel.

The previous description of embodiments is provided to enable a person skilled in the art to make and use the present invention. Moreover, various modifications to these embodiments will be readily apparent to those skilled in the art, and the generic principles and specific examples defined herein may be applied to other embodiments. Therefore, the present invention is not intended to be limited to the embodiments described herein but is to be accorded the widest scope as defined by limitation of the claims.

What is claimed is:

1. A workpiece supporting apparatus comprising:
 a Bernoulli chuck configured to generate a suction force by emitting a gas; and
 a liquid ejection member surrounding the Bernoulli chuck and configured to discharge a liquid around the Bernoulli chuck, wherein
 the liquid ejection member has a plurality of liquid ejecting openings arranged around the Bernoulli chuck,
 the Bernoulli chuck includes a plurality of gas jet openings facing outward in radial directions of the Bernoulli chuck, and the plurality of gas jet openings are arranged to emit the gas radially, and
 the plurality of liquid ejecting openings are located on a plurality of straight lines extending from the center of the Bernoulli chuck through the plurality of gas jet openings when viewed from above the liquid ejection member.

2. A workpiece supporting apparatus comprising:
 a Bernoulli chuck configured to generate a suction force by emitting a gas; and
 a liquid ejection member surrounding the Bernoulli chuck and configured to discharge a liquid around the Bernoulli chuck, wherein
 the liquid ejection member includes a side wall surrounding the Bernoulli chuck, a bottom portion coupled to the side wall, and a liquid ejecting opening facing an outer surface of the Bernoulli chuck, and the liquid ejecting opening is located such that when a liquid is discharged from the liquid ejecting opening, the liquid flows from an annular gap formed between an outer wall of the Bernoulli chuck and the side wall of the liquid ejection member outwardly along a surface of the workpiece.

3. The workpiece supporting apparatus according to claim 2, wherein the liquid ejecting opening is located in the bottom portion.

4. The workpiece supporting apparatus according to claim 2, wherein the liquid ejecting opening is located in an inner surface of the side wall.

5. A workpiece processing apparatus comprising:
a processing head configured to process a workpiece; and
a workpiece supporting apparatus according to claim 1, the workpiece supporting apparatus being configured to support the workpiece.

6. A workpiece transporting apparatus comprising:
a workpiece supporting apparatus according to claim 1, the workpiece supporting apparatus being configured to support a workpiece; and
a moving device configured to move the workpiece supporting apparatus.

7. A workpiece supporting method comprising:
supporting a workpiece by flow of gas, while sucking the workpiece by a suction force generated by emitting the gas from a Bernoulli chuck; and
discharging a liquid around the Bernoulli chuck from a liquid ejection member surrounding the Bernoulli chuck, wherein
the liquid flows outward along a surface of the workpiece from a plurality of liquid ejecting openings arranged around the Bernoulli chuck,
the gas is emitted radially outwardly from a plurality of gas jet openings of the Bernoulli chuck, and
the plurality of liquid ejecting openings are located on a plurality of straight lines extending from the center of the Bernoulli chuck through the plurality of gas jet openings when viewed from above the liquid ejection member.

8. A workpiece processing method comprising:
supporting a workpiece by flow of gas, while sucking the workpiece by a suction force generated by emitting the gas from a Bernoulli chuck; and
discharging a liquid around the Bernoulli chuck from a liquid ejection member surrounding the Bernoulli chuck, the liquid flows outward along a surface of the workpiece from a plurality of liquid ejecting openings arranged around the Bernoulli chuck,
the gas is emitted radially outwardly from a plurality of gas jet openings of the Bernoulli chuck, and
the plurality of liquid ejecting openings are located on a plurality of straight lines extending from the center of the Bernoulli chuck through the plurality of gas jet openings when viewed from above the liquid ejection member; and
processing the workpiece, while supplying the liquid to the workpiece.

9. The workpiece processing apparatus according to claim 5, wherein
the processing head comprises a polishing head configured to bring a polishing tool into contact with the workpiece to polish the workpiece,
the workpiece supporting apparatus further comprises a plurality of workpiece supporting apparatuses, and
the plurality of workpiece supporting apparatuses are arranged along the polishing tool.

* * * * *